United States Patent
Camp

(10) Patent No.: US 8,564,356 B2
(45) Date of Patent: Oct. 22, 2013

(54) METHOD AND APPARATUS FOR CLOCK CALIBRATION IN A CLOCKED DIGITAL DEVICE

(75) Inventor: Charles J. Camp, Sugar Land, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/471,204

(22) Filed: May 14, 2012

(65) Prior Publication Data

US 2012/0223757 A1    Sep. 6, 2012

Related U.S. Application Data

(63) Continuation of application No. 13/088,783, filed on Apr. 18, 2011, now Pat. No. 8,179,182, which is a continuation of application No. 12/624,267, filed on Nov. 23, 2009, now Pat. No. 7,928,791.

(51) Int. Cl.
*H03K 3/00*          (2006.01)

(52) U.S. Cl.
USPC .......................................... 327/299; 327/291

(58) Field of Classification Search
USPC ............. 327/94–95, 291–294, 298–299, 293, 327/295, 233–235
See application file for complete search history.

(56) References Cited

U.S. PATENT DOCUMENTS

| | | | |
|---|---|---|---|
| 6,876,186 B1 * | 4/2005 | Gupta | ......................... 324/76.54 |
| 7,157,953 B1 | 1/2007 | Nguyen | |
| 7,187,742 B1 | 3/2007 | Logue et al. | |
| 7,375,558 B2 | 5/2008 | Frank et al. | |
| 7,680,618 B2 * | 3/2010 | Spisak | .......................... 702/107 |
| 2009/0027085 A1 | 1/2009 | Ishii et al. | |

OTHER PUBLICATIONS

Xilinx, Inc. "BUFG (CPLD)," Xilinx, Inc., [retrieved from the Internet on Sep. 29, 2009 using URL: http://www.xilinx.com/itp/xilinx7/books/data/docs/cgd/cgd0056_17.html>].

Xilinx, Inc., "DCM—Digital Clock Manager," Libraries Guide, ISE 6.Ii, pp. 399-408, Xilinx, Inc., [retrieved from the Internet on Sep. 29, 2009 using URL: http://www.xilinx.com/itp/xilinx6/de/libs/dcm.pdf>].

Xilinx, Inc., "LogiCORE Digital Clock Manager—DCM Module," Product Specification, DS485, Apr. 24, 2009, Xilinx, Inc.

Kreuger, R., "Digital Clock Management in Virtex-4 Devices," Xcell Journal, First Quarter 2005.

Electronic Design, "Minimize clock-to-output delays in CPLD designs," Jan. 26, 1998, Penton Media, Inc., [retrieved from the Internet on Sep. 18, 2009 using URL: http://electronicdesign.com/Articles/Print.cfm?ArticleID=6333>].

(Continued)

*Primary Examiner* — An Luu
(74) *Attorney, Agent, or Firm* — Locke Lord LLP

(57) ABSTRACT

Methods and apparatuses provide a clocked digital device having dynamically adjustable operating characteristics. The digital device comprises a digital clock management ("DCM") circuit in which the amount of delay between receipt of an active edge of a clock signal at the input of the DCM circuit and appearance of an active edge of another clock signal at the output of the DCM circuit depends on a phase adjustment signal applied to the DCM circuit's phase adjust input. A phase adjustment circuit provides the phase adjustment signal to the DCM circuit's phase adjust input for controlling the amount of the delay between the clock signal at the input of the DCM circuit and the clock signal at the output of the DCM circuit.

20 Claims, 10 Drawing Sheets

(56) References Cited

OTHER PUBLICATIONS

Katrai, C., "Timing Margin Analysis for Clock Buffers in High Speed Synchronous Networking Systems," Application Note18, Mar. 17, 1999, Pericom Semiconductor Corporation.

Xilinx, Inc., "Virtex-4 User Guide," UG070 (v1.3), Apr. 11, 2005, pp. 1-383, Xilinx, Inc.

Xilinx, Inc., "Spartan-3A FPGA Family: Data Sheet," Product Specification, DS529-1, version 1.8, Mar. 6, 2009, Xilinx, Inc.

Xilinx, Inc., "Using Digital Clock Managers (DCMs) in Spartan-3 FPGAs," Application Note: Spartan-3 and Spartan-3L FPGA Families, XAPP462, version 1.1, Jan. 5, 2006, Xilinx, Inc.

Xilinx, Inc., "Virtex-4 FPGA Data Sheet: DC and Switching Characteristics," Product Specification, DS302, version 3.7, Sep. 9, 2009, Xilinx, Inc.

Kowalczyk, J., "Minimizing Receiver Elastic Buffer Delay in the Virtex-II Pro RocketIO Transceiver," Application Note: Virtex-II Pro Family, XAPP670, version 1.0, Jun. 10, 2003, Xilinx, Inc.

International Application Status Report for International Patent Application No. PCT/US2001/031251 filed Oct. 5, 2001.

\* cited by examiner

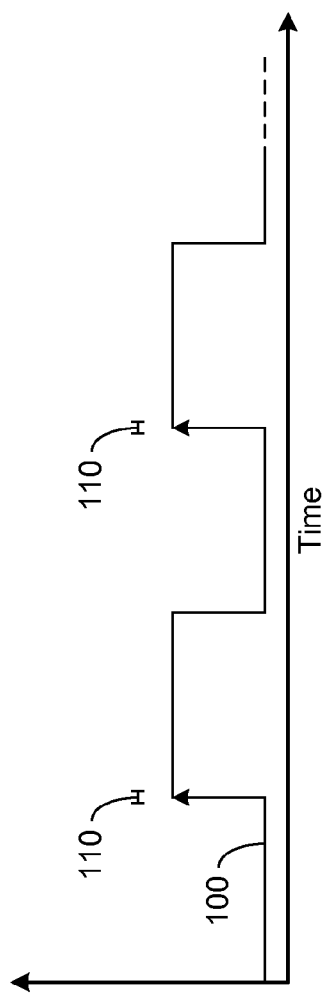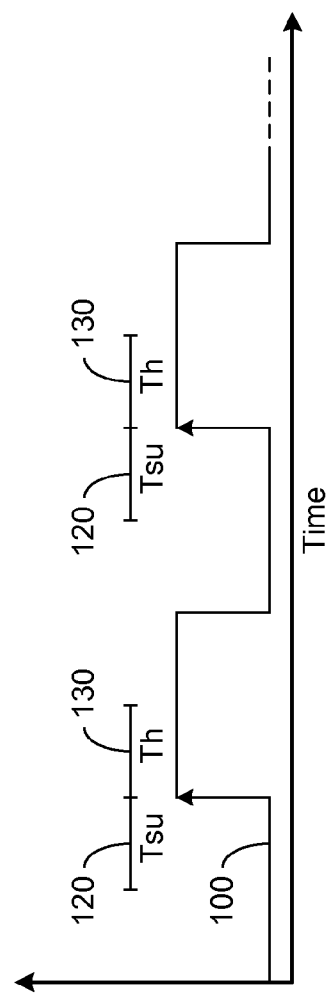

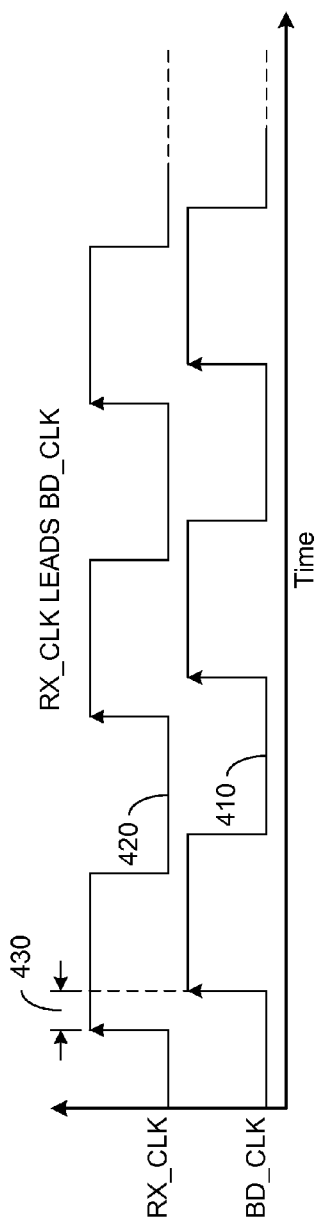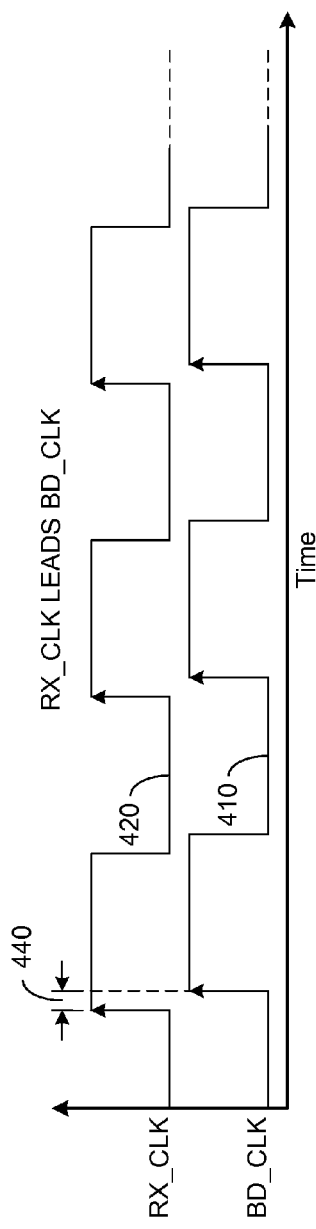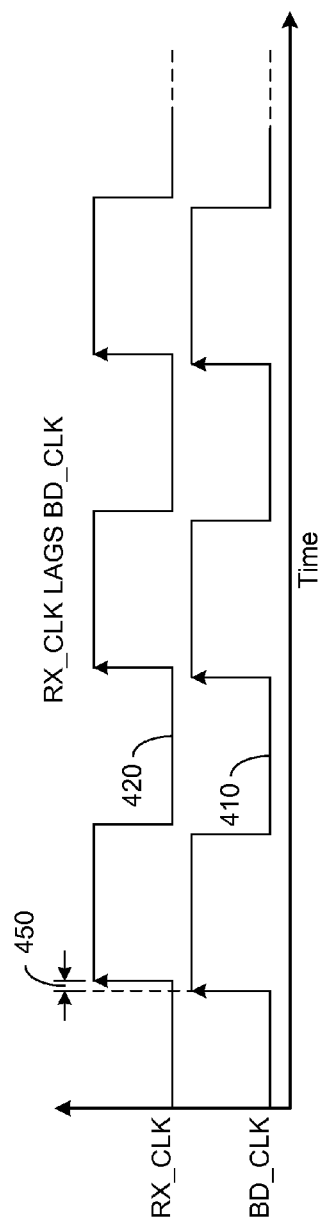

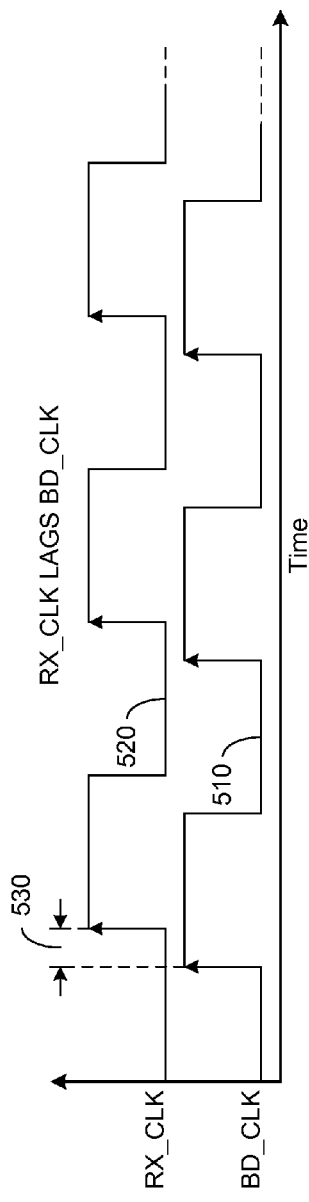
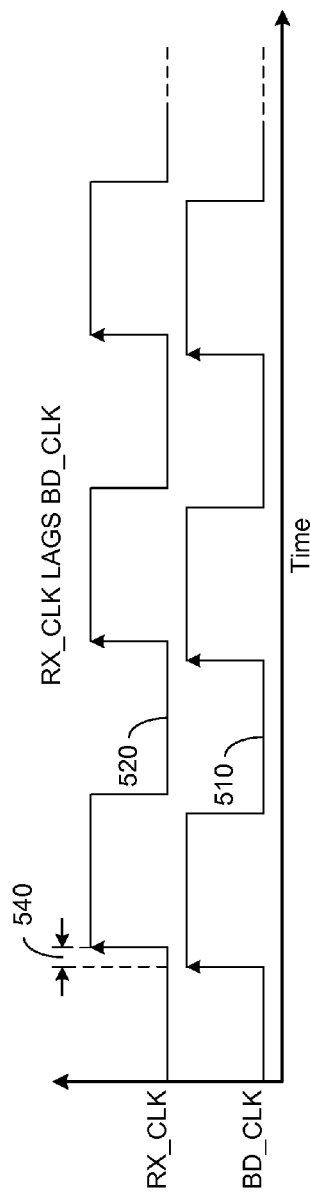
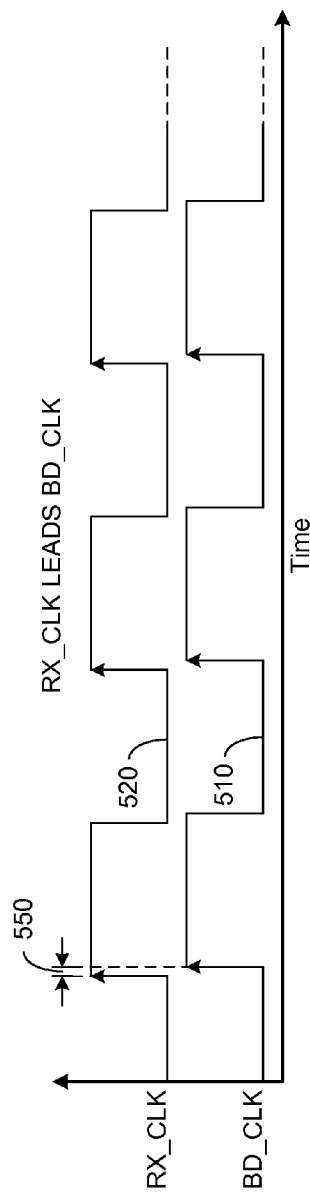

METHOD AND APPARATUS FOR CLOCK CALIBRATION IN A CLOCKED DIGITAL DEVICE

CROSS REFERENCE TO RELATED APPLICATIONS

This application for patent is a continuation of U.S. Non-Provisional Application Ser. No. 13/088,783 (now U.S. Pat. No. 8,179,182), entitled "Method and Apparatus for Clock Calibration in a Clocked Digital Device," filed Apr. 18, 2011, which is a continuation of U.S. Non-Provisional Application Ser. No. 12/624,267 (now U.S. Pat. No. 7,928,791), entitled "Method and Apparatus for Clock Calibration in a Clocked Digital Device," filed Nov. 23, 2009, the foregoing applications being incorporated herein by reference their entireties.

STATEMENT REGARDING FEDERALLY SPONSORED RESEARCH

Not applicable.

REFERENCE TO APPENDIX

Not applicable.

BACKGROUND OF THE INVENTION

1. Field of the Invention

This disclosure relates generally to methods and apparatuses for calibrating clocks in clocked digital devices.

2. Description of the Related Art

Many modern electronic devices operate based on clock signals that are provided to the device from an external source and/or generated internal to the electronic devices. Such devices are referred to herein as clocked digital devices.

Because of their nature, clocked digital devices can and do exhibit a range of different performance characteristics based on the manufacturing and operating conditions associated with the devices. For example, multiple units of the same model of a clocked digital device may exhibit different operating characteristics due to variance in the processes used to create the units and in the characteristics of the materials used in the manufacturing processes. As another example, the same unit of a given clocked digital device can exhibit a first set of operating characteristics when operating at a first voltage and a second set of operating characteristics when operating at a second voltage. Still further, the same unit of a given clocked digital device can exhibit one set of operating characteristics when operating at a first temperature and a different set of operating characteristics when operating at a second temperature.

One set of operating characteristics that can vary depending on process, voltage, and/or temperature is the set of characteristics related to the timing performance of a clocked digital device. One such exemplary characteristic is the precise amount of time required for a clocked digital device to provide a valid output signal after receiving an active edge on a clock signal whose transitions produce the output in question. Another such exemplary characteristic is the precise length of time that an input to a clocked digital device must remain stable (in the same logical state) prior to receipt of an active edge on a clock signal used to capture (receive) the input signal. Yet another exemplary characteristic is the precise length of time that an input to a clocked digital device must remain stable (in the same logical state) following receipt of an active edge on a clock signal used to capture the input signal. Each of these exemplary characteristics, as well as other characteristics of a clocked digital device, can vary depending on process, voltage, temperature, or other operating characteristics.

Because of the variability of clocked digital devices, adjustments must often be made that can reduce the predictability and/or performance of systems including such devices. For example, in an ideal situation, a clocked digital device intended to capture a digital input signal in response to a given clock signal would capture the input digital signal precisely at the active edge of the clock signal. This ideal situation is illustrated in FIG. 1A, which depicts a clock signal 100 with the active edge defined to be the rising (low-to-high) edge of the clock signal. Also illustrated in FIG. 1A are lines 110 representing the time interval during which valid data must be present at the input to the idealized clocked digital device in order to facilitate proper reception of the input signal. Because it is assumed in this example that the clocked digital device samples its input precisely at the active edge of the clock, there is only a very limited period of time (ideally a time interval of 0 centered at exactly the low-to-high transition point of the clock signal) during which the input data must be valid.

In practice, clocked digital devices are not ideal. As such, a clocked digital device will not sample its input value precisely at the active edge of the externally-generated clock supplied to the device. In real operation, the input data may ultimately be sampled at a point that occurs either earlier or later in time relative to the active edge of the relevant clock. Moreover, because of variations in manufacturing processes, construction materials, temperature, voltage, and other operating conditions, the precise time at which a clocked digital device samples an input will not typically be consistent, but will vary from unit to unit, device to device, and from one operating condition (e.g., temperature or voltage) to another operating condition for a given unit or device.

To account for the variable operating conditions as described, it is often necessary to regulate and control the manner in which such devices are used. For example, in the above example, it was noted that the actual time at which a given clocked digital device may sample a desired input can vary from a time prior to the active edge of the relevant clock to a time after the active edge of the relevant clock. Thus, to ensure that such a device consistently receives valid data, it will be necessary to ensure that the inputs to the device remain valid and constant for a time interval spanning all possible sampling points. This time interval must begin before the active clock edge (in case the sampling occurs earlier) and end after the active clock edge (in case the input is sampled later).

The time interval during which an input to a device must remain valid and stable prior to the receipt of an active edge of the relevant clock is commonly referred to as the "setup time" and is often designated as Tsu. The time period after the active clock edge during which the input to a device must remain valid and stable is commonly referred to as the "hold time" and is often designated Th. FIG. 1B illustrates an exemplary Tsu time 120 and Th time 130 for one input of a clocked digital device with respect to exemplary clock signal 100. Tsu and Th may be negative quantities. A positive setup time and negative hold time defines a time interval prior to the active edge of the relevant clock. Likewise, a negative setup time and positive hold time defines a time interval after the active edge of the relevant clock. Based upon the preceding definition of Tsu and Th, a given input signal should not simultaneously exhibit negative values for both Tsu and Th.

Another important operating parameter for a digital device is commonly known as the clock-to-output time, often designated Tco. For a given output of a clocked digital device and a given clock signal, Tco typically represents the longest expected amount of time required for a valid output signal to appear following the active edge of the given clock. Like the Tsu and the Th values, the value of Tco for a given clocked digital device is subject to variation as a result of process, voltage, temperature and other operating conditions. Tco may also be a negative quantity, although this will occur only when an "early" version of the clock signal is available inside of the device, e.g. when using a phase-locked loop (PLL) or other similar clock management resource. A negative Tco value does not imply a non-causal relationship between an output signal and its corresponding clock.

Ideally the Tsu and Th values for a clocked digital device's inputs, and the Tco value for its outputs, would be zero. Practically, however, these values are set to account for the maximum range of possible delays that the associated clocked digital device may encounter in expected operation. As a result, to ensure predictable and robust operations, systems utilizing such devices must typically account for the range of potential operating conditions, which generally results in slower system operation than would be possible if the Tsu, Th and Tco values were at, or nearly at zero, and if the Tsu, Th and Tco values were not subject to variation as a result of differing manufacturing and/or operating conditions. Accordingly, there is a need and benefit to providing apparatuses and methods that can dynamically control and adjust the Tsu, Th and Tco values to compensate for operation and manufacturing variations and to hold the values of Tsu, Th, and Tco constant, independent of those variations.

Because of the potential benefits of having the output of a clocked digital device be valid at, or shortly after, the active edge of the relevant clock, attempts have been made to develop and utilize active circuits to try to provide some form of clock-to-output time or Tco compensation to try to ensure that the apparent clock-to-output time, Tco, for a device including the circuit is equal to zero, as determined from the active clock edge. If the relevant clock signal is free-running and periodic, then similar benefits may also be obtained from the less stringent requirement that Tco be an integral multiple of the relevant clock period, as determined from the active clock edge. In situations where the apparent Tco is an integral multiple of the period of the relevant clock, a valid output from the device will occur coincident with an active edge of the relevant clock. Since the relevant clock will be a periodic signal, having Tco be an integral multiple of the clock period as determined from the active clock edge is functionally equivalent to having a Tco of zero.

FIG. 2 illustrates a simplified representative version of a conventional approach used to adjust and control Tco. Referring to FIG. 2, portions of a digital device 200 are illustrated. The exemplary simplified device 200 includes an externally accessible input pin 210, a digital clock manager ("DCM") circuit 220, and a clock distribution buffer 230. The conventional approach involves the use of an input pin 210 to receive an externally-supplied clock signal, a dual data rate ("DDR") flip-flop 240, and an externally accessible output pin 250. Pin 250 may be a bi-directional input/output pin and may be associated with appropriate buffer and driver circuitry. In operation, an externally-supplied periodic clock signal (not illustrated) is provided to the input pin 210. While not necessarily reflecting any specific structure, boxes 260 and 270 are provided to reflect sources of signal propagation delay encountered in transmitting the various signals described herein.

In operation, as mentioned above, an externally supplied periodic clock signal is provided at the input pin 210 of the clocked digital device 200. The received clock signal is then connected from the input pin 210 to the input (IN) of DCM circuit 220. Because the clock signal will be subject to various internal delays, delays that may vary depending on manufacturing or operating conditions, the clock signal received at the input (IN) of DCM circuit 220 will not typically be exactly aligned with the clock signal actually received at the input pin 210. The DCM circuit 220 receives the clock signal at its input (IN) and generates and provides an output clock signal at its output (OUT). The clock output signal from the DCM circuit 220 is provided as an input to a clock distribution buffer 230. The clock distribution buffer 230 distributes the received clock signal internally to portions of the digital device 200 in such a manner that the distributed clock signal is aligned, or substantially aligned, at every destination point within the device (low skew). In the example of FIG. 2, the clock signal from the clock distribution buffer 230 is used to clock one or more output registers of the digital device 200.

In FIG. 2, the output of the clock distribution buffer 230 is provided as the clock input to an output DDR register 240 configured with constant values for its rising-edge and falling-edge data inputs. Because of its configuration, and because it treats both the rising and falling edges of its received clock as active, the output of register 240 alternates between a logic "1" high level and a logic "0" low level to produce a periodic clock signal having a period that is substantially the same as the period of the supplied clock signal received at pin 210.

The clock signal provided by the DDR output register 240 is provided to bidirectional (IO) pin 250 and the clock signal at IO pin 250 is provided to the feedback input (FB) of the DCM circuit 220. The clock signal provided to the feedback input of the DCM circuit 220 will be subject to some delay (represented by block 270) such that the clock received at the feedback input to the DCM circuit 220 will not be exactly aligned with the clock signal provided to pin 250.

In operation, the DCM circuit 220 will adjust its output clock signal (OUT) until its input (IN) and its feedback input (FB) receive frequency-matched clock signals having coincident active edges (time-aligned). If the routing delay 260 to which the supplied clock signal is subjected is equal to the routing delay 270 to which the clock at pin 250 is subjected, then the output signal at pin 250 will be aligned with the input signal at pin 210 and the apparent clock-to-out of the digital device 200 will be zero or nearly zero relative to the input clock signal at pin 210. Since the clock distribution buffer 230 is designed for low-skew signal distribution, any other output signal sourced from an output register using the same clock will also exhibit a Tco of zero or nearly zero relative to the input clock signal at pin 210. The net result of this technique is a Tco for output signals, relative to the supplied clock signal received at pin 210, of zero or nearly zero. And because of the dynamic adjustment implemented by the DCM circuit 220, this value of Tco will exist independent of variations in process, temperature or voltage.

There are several drawbacks to the simplified compensation circuit of FIG. 2. As one example, the ability of the circuit to produce a Tco that is at, or nearly at, zero hinges on the assumption that the routing delay 260 experienced by the supplied clock signal received at pin 210 is identical to the routing delay 270 experienced by the clock signal provided to pin 250. In practice, such routing delays are almost never identical. Moreover, for a given clocked digital device, it can be difficult or impossible to identify an unused output pin that would be subject to routing delays that are the same, or substantially the same, as those for the supplied clock signal. Even if the routing delays are initially the same or similar, they may not be subject to the same variations as a result of manufacturing and/or operating conditions. As such, there will be differences between the routing delays 260 and 270 and the illustrated representative circuit will not be able to compensate for those variations. Further still, this simplified compensation technique does not provide any mechanism to calibrate Tsu and Th characteristics for a given device.

Accordingly, what is needed is a more effective and efficient way to dynamically adjust and control the clock-to-output time, setup time, and hold time for one or more outputs of a clocked digital device.

SUMMARY OF THE INVENTION

The disclosed embodiments are directed to methods and apparatuses for dynamically adjusting the operating characteristics of a digital device to account for differences between an externally-supplied clock signal and an internally-generated clock signal. In some embodiments, the methods and apparatuses provide a clocked digital device having dynamically adjustable operating characteristics. The digital device comprises a first input pin for receiving an externally supplied clock signal, and a first digital clock management ("DCM") circuit having an input, a phase adjust input and an output. The input of the first DCM circuit is coupled to receive a clock signal corresponding to the externally supplied clock signal, and the output of the first DCM circuit provides an internal clock signal having a frequency corresponding to the frequency of the clock signal received at the input of the first DCM circuit. The amount of delay between receipt of an active edge of the clock signal received at the input of the first DCM circuit and appearance of an active edge of the internal clock signal provided at the output of the first DCM circuit responds to a signal applied to the first DCM circuit's phase adjust input. The digital device also comprises a first clocked register having an input, an output, and a clock input. The input of the first clocked register is coupled to receive a clock signal corresponding to the externally supplied clock signal, and the clock input of the first clocked register is coupled to receive the internal clock signal provided at the output of the first DCM circuit. The first clocked register is configured to sample the value of the clock signal at its input in response to receipt of the active edge of the internal clock signal provided at the output of the first DCM circuit. The digital device further comprises a first delay adjustment circuit having an input and an output, where the input is coupled to receive a signal from the output of the first clocked register and the output is coupled to the first DCM circuit's phase adjust input. The first clocked register outputs a digital signal that can vary between a logic high level and a logic low level, and the first delay adjustment circuit provides an output signal that varies in response to this digital signal to adjust the amount of delay between the receipt of the active edge at the input of the first DCM circuit and the appearance of the active edge of the internal clock signal provided at the output of the first DCM circuit.

In some embodiments, the disclosed methods and apparatuses provide a field programmable gate array. The field programmable gate array is configured to provide a first pin adapted to receive an externally supplied clock signal, and a phase shifter coupled to the first pin, the phase shifter being adapted to provide an output clock signal that corresponds in frequency to a clock signal provided to the first pin and that varies in phase from the clock signal provided to the first pin by an amount that corresponds to a phase adjustment signal. The field programmable gate array is also configured to provide a first register coupled to the first pin and to the phase shifter, and adapted to sample the value of the clock signal appearing at the first pin in response to the output clock signal provided by the phase shifter. The field programmable gate array is further configured to provide a second pin adapted to receive an externally supplied input signal, and a second register coupled to the second pin and to the phase shifter, the second register being adapted to sample the value of the input signal appearing at the second pin in response to the output clock signal provided by the phase shifter. The field programmable gate array is finally configured to provide a phase control circuit coupled to the phase shifter and the first register, the phase control circuit being adapted to provide the phase adjustment signal to the phase shifter, and further adapted to adjust the phase adjustment signal in such a manner that the set-up time for an input signal provided to the second pin approaches zero with respect to the externally supplied clock signal.

In some embodiments, the disclosed methods and apparatuses provide an apparatus for reducing the set-up time of an input signal provided to a clocked input buffer with respect to a reference clock signal. The apparatus comprises a first clock manager having an input coupled to receive the reference clock signal, and a phase adjust input for receiving a phase adjust signal. The clock manager is configured to provide an output clock signal having the same frequency as the reference clock signal, the clock signal having a phase relationship with respect to the reference clock signal that is determined by the phase adjust signal. The apparatus also comprises a clocked buffer having a data input and a clock input, where the data input of the clocked buffer is coupled to receive the reference clock signal and where the clock input of the clocked buffer is coupled to receive the output clock signal from the first clock manager. The apparatus further comprises phase compensation circuitry coupled to receive an output signal from the clocked buffer, the phase compensation circuitry providing a phase adjust signal in response to the output signal of the clocked buffer, the phase adjust signal being adapted to bring the output clock signal from the first clock manager towards alignment with the reference clock signal. In one implementation, the clocked input buffer includes an input and a clock input, the input being sampled in response to a clock signal applied to the clock input and wherein the output clock signal provided by the first clock manager is provided to the clock input of the clocked input buffer.

Other embodiments are disclosed and claimed.

BRIEF DESCRIPTION OF THE DRAWINGS

FIG. 1A illustrates a hypothetical ideal situation in which a clocked digital device captures a digital input signal in response to a given clock signal precisely at the active edge of the clock signal for an exemplary clock signal having an active rising edge of the clock.

FIG. 1B illustrates an exemplary Tsu time and an exemplary Th time for one input of a clocked digital device with respect to the exemplary clock signal.

FIG. 4A-4C and 5A-5C illustrate situations that may exist within the various embodiments with respect to the alignment of an internal clock signal with an externally-supplied clock signal.

DETAILED DESCRIPTION

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having a benefit of this disclosure. It must be understood that the inventions disclosed and taught herein are susceptible to numerous and various modifications and alternative forms. Lastly, the use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims.

Figure 2:
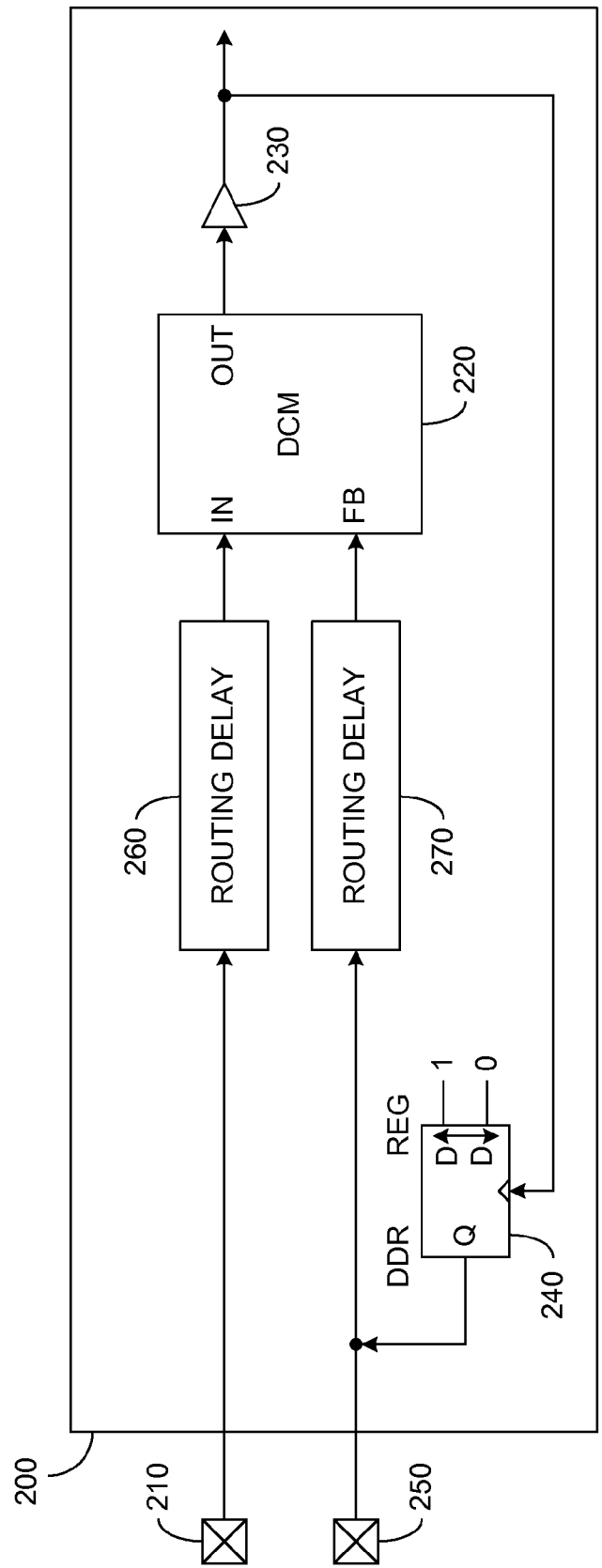
FIG. 2 illustrates a simplified representative version of a conventional approach used to adjust and control Tco.
Figure 3A:
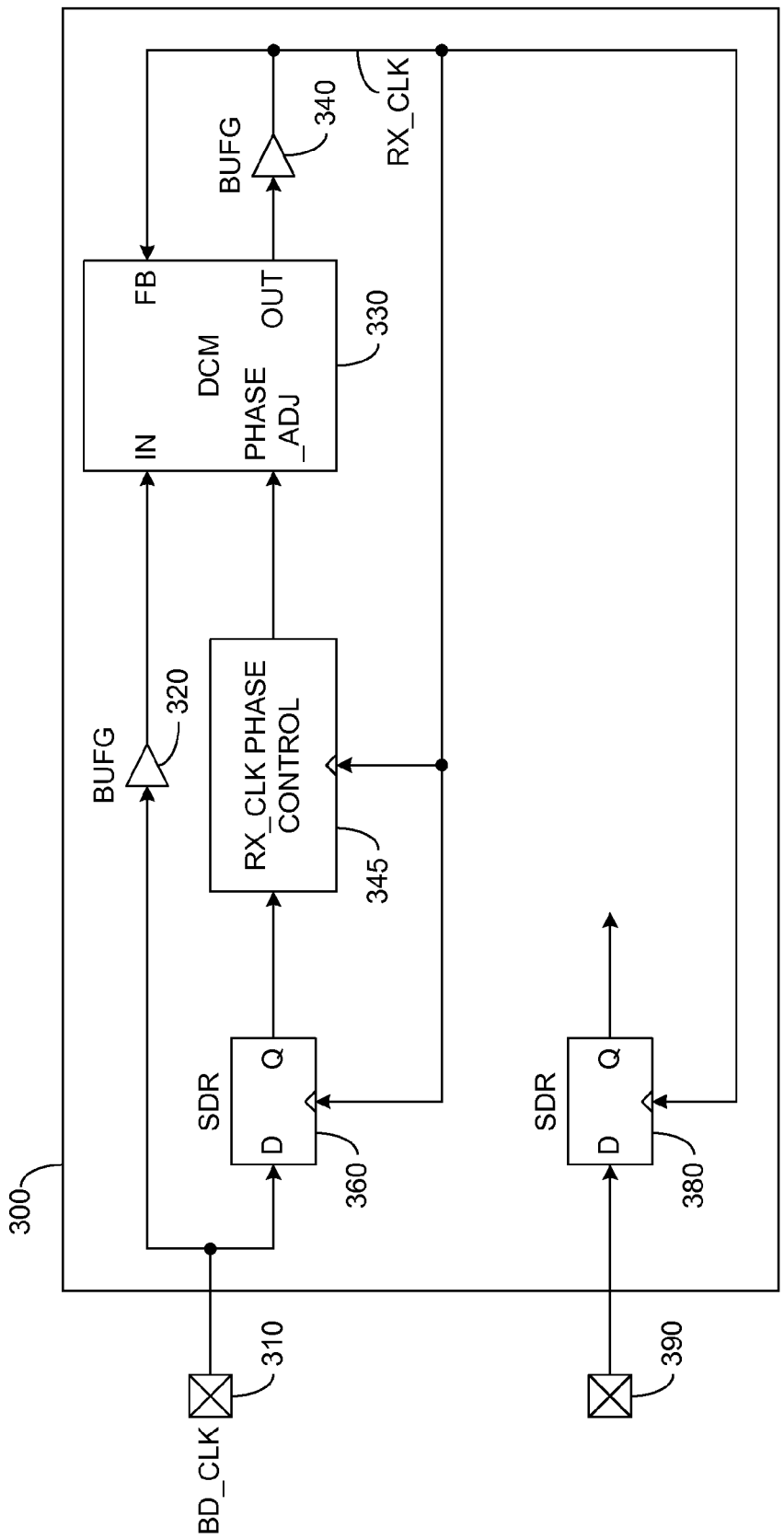
FIGS. 3A and 3B illustrate alternate embodiments of a novel circuit that may be beneficially used to dynamically control the setup time, Tsu, for a given input of a digital device to a value that is at, or very nearly at, zero with respect to a reference clock signal.

Turning to the drawings and, in particular, to FIG. 3A, a novel circuit is illustrated that may be beneficially used to dynamically set the setup time (Tsu) and the hold time (Th) for a given input of a digital device to a value that is at, or very nearly at, zero with respect to a reference clock signal.

Referring to FIG. 3A, a digital device 300 is disclosed. The digital device 300 may include a number of digital circuits, only a few of which are illustrated in FIG. 3A. Although not illustrated, the digital device 300 may also include one or more analog circuits.

The digital device 300 may be any digital device and may be formed from discrete components positioned on a printed circuit board or a number of circuits formed on one or more integrated circuit chips. In one embodiment, the digital device 300 is a field programmable gate array ("FPGA"). Examples of such devices include those within the Xilinx Spartan-3 family of products (such as the XC3S1400A device) and Xilinx Virtex-4 family of products (such as the XC4VFX40 device). Other types of FPGAs can be used without departing from the scope and spirit of the present disclosure. In the embodiment where digital device 300 is an FPGA, the illustrated circuitry may be established through appropriate configuration/programming of the FPGA device. The precise manner of configuration will vary depending on the specific FPGA device that is used.

Referring to FIG. 3A, the digital device 300 includes an input pin 310 that is adapted to receive an externally-supplied clock signal. The input pin 310 may take the form of any structure that is suitable for the receipt of an externally-supplied clock signal such as, for example and without limitation, a pin of the type used with through-hole printed circuit boards, a contact lead of the type used with surface mount devices, a contact pad of the type used with land grid arrays, or any other structure that is suitable for the receipt of an externally-generated clock signal.

In one embodiment of FIG. 3A, the externally-supplied clock signal is a board-level clock signal that is supplied both to the digital device 300 and to other digital devices (not illustrated) located on the same physical printed circuit board as digital device 300. As such, the externally supplied signals will be referred to herein as a board-level clock signal BD_CLK. In other embodiments, the externally supplied clock may be distributed to devices that are not located on the same printed circuit board as digital device 300, but are instead connected to the printed circuit board through cables or other interconnection mechanisms.

In the illustrated embodiment of FIG. 3A, the supplied clock signal BD_CLK is received at pin 310 and provided to a first clock distribution buffer 320. The purpose of the first clock distribution buffer 320 is to connect the input of the buffer to a low-skew global clock line (not illustrated) within the device 300. The global clock line then distributes the clock signal received at its input throughout the digital device 300 using a network that introduces minimum skew between the signals received at various endpoints (loads) within the device. In the embodiment where the digital device 300 is a FPGA, such as a Xilinx FPGA, the first clock distribution buffer 320 may take the form of a global buffer referred to as a BUFG buffer that is set to map an input clock signal to a global clock line.

The inclusion of the first clock distribution buffer 320 in the circuitry of FIG. 3A is not essential and embodiments are envisioned in which the first clock distribution buffer 320 is omitted from the circuit. The first clock distribution buffer 320 is useful in applications where there is a desire or need to make the supplied clock signal received at pin 310 widely available within the digital device 300, and where it is beneficial to distribute the board-level clock signal with minimal skew.

Referring to FIG. 3A, the output from the clock distribution buffer 320 is provided to the input (IN) of a digital clock manager ("DCM") circuit 330. As reflected in FIG. 3A, the DCM circuit 330 also includes a delay or phase adjust input (PHASE_ADJ), a feedback input (FB), and an output (OUT) that is connected back to the feedback input through a second clock distribution buffer 340. In general operation, the DCM circuit 330 receives a clock signal at its input and generates an output clock signal that is phase shifted from the input signal by an amount that depends upon the signal (or signals) received at the phase adjust input of the DCM circuit 330. More specifically, the DCM circuit 330 uses internal circuitry to adjust its output clock signal (OUT) such that the steady-state timing differences between the clock signal received at the DCM input (IN) and the clock signal received at the DCM feedback input (FB) are held to a predetermined fixed delay quantity (or phase shift) plus or minus a variable delay quantity (or phase shift), with the latter set by the signal(s) provided to the DCM's phase adjust (PHASE_ADJ) input.

The DCM circuit 330 may be implemented in a number of different ways. When the digital device 300 comprises discrete devices, the DCM circuit 330 may be formed from a number of discrete components that implement the functionality described above. When the circuitry of FIG. 3A is implemented in an FPGA, the DCM circuit 330 may take the form of one or more pre-existing FPGA components or functional blocks that perform the described functionality. For example, in embodiments where the FPGA is one of the Xilinx FPGA devices (such as a Spartan-3 or Virtex-4 FPGA), the DCM circuit 330 may take the form of one of the existing DCM circuits that are provided as standard components within such devices.

Referring still to FIG. 3A, the output of the DCM circuit 330 is applied as the input to the second clock distribution buffer 340. The second clock distribution buffer 340 performs the same general function as the first clock distribution buffer 320 with respect to the clock signal that it receives as its input, and may be constructed in the same manner as the first clock distribution buffer 320. For example, in embodiments where the circuitry of FIG. 3A is implemented in an FPGA, such as a Xilinx FPGA, the second clock distribution buffer 340 can be another BUFG buffer.

As will be appreciated, the second clock distribution buffer 340 can distribute the clock signal received at its input throughout the digital device 300 to a variety of components and/or devices and/or elements. In the example of FIG. 3A, the clock signal from the second clock distribution buffer 340 is provided to the feedback input of the DCM circuit 330. As noted above, the DCM circuit 330 of FIG. 3A internally adjusts its output clock signal (OUT) to align the clock signal received at its input (IN) with the clock signal received at its feedback input (FB) so that the two signals differ in time (or phase shift) by a quantity that depends upon the signal(s) received at the phase adjust (PHASE_ADJ) input of the DCM circuit 330.

In the circuit of FIG. 3A, the phase adjust input to the DCM circuit 330 is provided by a compensation circuit that includes a single data rate (SDR) input register 360 and clock phase control circuitry 345 (RX_CLK PHASE CONTROL). The SDR input register 360 samples the BD_CLK signal supplied at 310 using RX_CLK. Since RX_CLK is derived from the BD_CLK signal supplied at 310, the BD_CLK is effectively sampling itself (serving in the role of both data and clock) at SDR input register 360. The phase control circuitry 345 essentially serves to increase or decrease the phase delay of the signal provided by the DCM circuit 330 in response to signals from the SDR input register 360. Such a phase control circuit 345 may be implemented using standard components and techniques known to those having ordinary skill in the art, for example, by programming/configuring one of the Xilinx FPGA devices mentioned earlier. In general operation, the compensation circuit dynamically generates one or more signals to be provided to the phase adjust input of the DCM circuit 330 to establish a predetermined timing relationship between the clock signal and the data input signal at SDR input register 360. In one preferred embodiment, this timing relationship is such that the timing differences between the clock signal and the data input signal to the at the SDR input register 360 approach zero or are very nearly zero (e.g., where the variation is less than 8% of the period of the clock signal received at pin 310).

For purposes of the following discussion, it is assumed that the compensation circuit will be operated to establish and maintain a DCM phase delay that causes the input data signal to SDR input register 360 to be sampled at or very near a particular transition (low-to-high or high-to-low) of the input signal.

In the embodiment of FIG. 3A, the clock signal BD_CLK received at pin 310 is provided as the input to an SDR register 360. This SDR register 360 is clocked by a clock signal that is provided by the second clock distribution buffer 340. Thus, the SDR register 360 will sample the supplied clock signal received at the input pin 310 with the internal data reception clock signal (RX_CLK) used throughout the digital device 300. As noted above, the internal data reception clock signal RX_CLK will be the supplied clock signal BD_CLK (as provided to the DCM circuit 330) delayed by an amount determined by the compensation circuit plus any other internal delays inherent to the distribution path of the clock signal. It is important to note that the clock signal supplied from clock distribution buffer 340 does not necessarily exhibit low propagation delay between the buffer and its various destinations (loads), but it does exhibit predictable and relatively low skew. Hence, resources using the RX_CLK supplied by clock distribution buffer 340 will "see" clock signals that are roughly time-aligned with one another.

This special relationship between the internal clock signal RX_CLK used to clock the SDR register 360 and the supplied clock signal BD_CLK that is provided at the input to the SDR register 360 allows the circuitry to set the delay/phase adjustment signal(s) to values such that the internal clock signal RX_CLK and the supplied BD_CLK signal at pin 310 are aligned, or nearly aligned, at the corresponding inputs of SDR register 360. For purposes of the following discussion it is assumed that the active edge of the clock is the rising edge, although those of ordinary skill in the art having the benefit of this disclosure will be able to implement the described apparatuses and methods with systems in which the falling edge is the active edge and/or systems in which both the rising and falling edges of the clock signals are active.

In operation, the SDR circuit 360 will sample the value at its input in response to the rising edge of the internal clock signal RX_CLK. Because the input to the SDR circuit 360 is the supplied clock signal BD_CLK, the output of the SDR register 360 will provide an indication of the relationship between the supplied clock signal BD_CLK and the internal clock signal RX_CLK as the relationship exists at the inputs to SDR register 360. This aspect of the circuit of FIG. 3A is generally illustrated in FIGS. 4A-4C. In each of FIGS. 4A-4C, and for the remainder of the discussion regarding FIGS. 4A-4C, the timing relationships between BD_CLK and RX_CLK are illustrated as they exist at SDR register 360. Given identical scenarios to those portrayed in FIGS. 4A-4C, the relationships between BD_CLK and RX_CLK will generally differ if the signals are viewed at different locations within digital device 300.

FIG. 4A illustrates a situation that may exist where the internal clock signal RX_CLK is not aligned (or nearly aligned) with the externally-supplied clock signal BD_CLK at pin 310. In particular, FIG. 4A illustrates an exemplary externally-supplied clock signal BD_CLK 410 and an exemplary internal clock signal RX_CLK 420 that is not aligned with the supplied clock signal BD_CLK 410. The misalignment between the two clock signals is indicated here by time difference 430.

In the example illustrated in FIG. 4A, the rising (or low-to-high) transition of the internal clock signal RX_CLK will occur at a time when the externally-supplied clock signal BD_CLK is at its low or logic "0" value. Thus, in this embodiment, the SDR register 360 will clock in a logic "0" on the active edge of the internal clock signal RX_CLK. The existence of a "0" will indicate that the supplied clock signal BD_CLK and the internal clock signal RX_CLK are not in alignment. In this example, the rising edge of the internal clock signal RX_CLK can be considered to have occurred "before" the rising edge of the externally-supplied clock signal BD_CLK such that the internal clock signal RX_CLK can be described as "leading" the externally-supplied clock signal. When considered in this regard, one can move the internal clock signal RX_CLK towards closer alignment with the externally-supplied clock signal BD_CLK by delaying the internal clock signal RX_CLK. This delay can be accomplished by adjusting the signal(s) applied to the PHASE_ADJ input of the DCM circuit 330 to increase the amount of delay between the input clock to the DCM circuit 330 and the output clock of the DCM circuit 330. This adjustment in the delay can be accomplished by the RX_CLK PHASE CONTROL circuit 345 in a variety of ways and the precise manner of adjusting the delay will depend on the specific operation of the DCM circuit 330. In embodiments where the PHASE_ADJ signal is a digital signal, the PHASE_ADJ value can be incremented by predefined increments to increase the delay.

In one embodiment, the phase control circuit 345 responds to the receipt of a logic "0" value by increasing the amount of delay by a margin equal to the smallest allowable increase in the delay value. This increase will have the effect of tending to move the internal clock signal RX_CLK into closer alignment with the supplied clock signal BD_CLK. One example of such a movement is shown in FIG. 4B, where the delay has resulted in a relative adjustment of the RX_CLK with respect to the supplied clock signal BD_CLK.

In this example, the result of the increase in the delay value is not sufficient to bring the internal clock signal RX_CLK into alignment with the supplied clock signal BD_CLK (as indicated by time difference 440). As such, the internal clock signal RX_CLK will continue to lead the supplied clock signal BD_CLK and the output of the SDR register 360 will continue to be a logic "0." This operation will, as described above, result in a further increase in the length of the delay introduced by DCM circuit 330. Eventually, after several iterations, this process will result in the amount of delay being such that the relationship between the internal clock signal RX_CLK and the supplied clock signal BD_CLK causes the SDR register 360 to output a logic "1" value. This situation is reflected in FIG. 4C, where the internal clock signal RX_CLK has been delayed to the point that it is just beginning to lag the supplied clock signal BD_CLK (see gap 450).

Figure 3B:
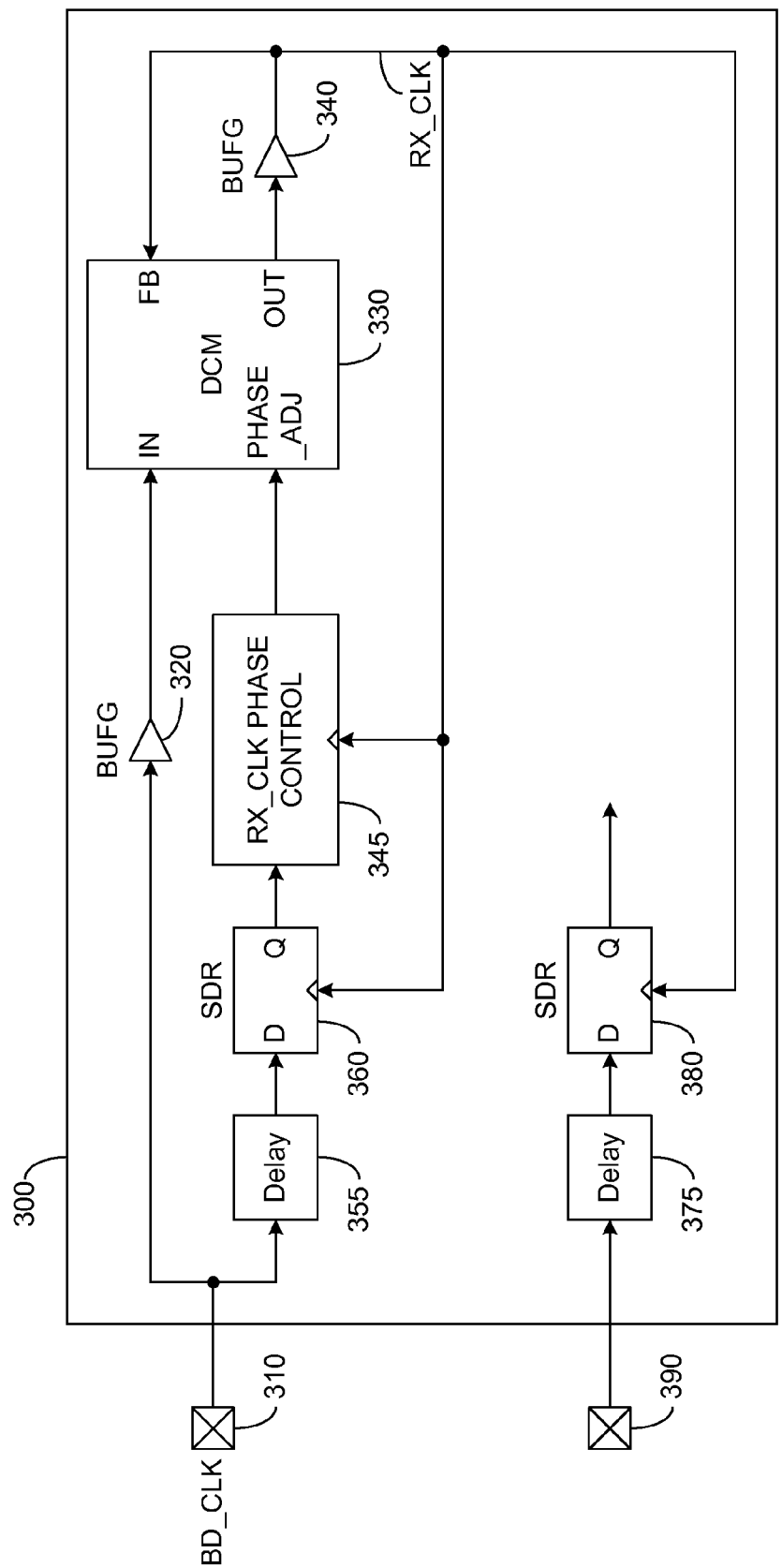

At the time the output of the SDR register 360 transitions from a logic "0" to a logic "1" level, the phase of the internal clock signal RX_CLK will have just transitioned from leading to lagging the supplied clock signal BD_CLK. This transition of the output from a logic level "0" to a logic level "1" will occur when the internal clock signal RX_CLK is very nearly aligned with the externally-supplied clock signal BD_CLK. Those of ordinary skill in the art will realize that the transition from leading to lagging (from "0" to "1") will present the potential for metastability at the output of SDR register 360. Standard techniques exist for mitigating the effects of metastability, most commonly the use of multiple additional pipeline registers, and it is assumed that such techniques are employed by any circuitry that utilizes the output of SDR register 360. In FIGS. 3A-3B, mitigation of metastability is performed by the RX_CLK PHASE CONTROL circuit 345 using known techniques.

In the example of FIGS. 4A-4C, the internal clock signal RX_CLK was initially described as leading the supplied clock signal BD_CLK. FIGS. 5A-5C illustrate an example where the internal clock signal RX_CLK initially lags the supplied clock signal BD_CLK. As with FIGS. 4A-4C, FIGS. 5A-5C and the associated discussions illustrate timing relationships between BD_CLK and RX_CLK as they exist at SDR register 360. Given identical scenarios to those portrayed in FIGS. 5A-5C, the relationships between BD_CLK and RX_CLK, will generally differ if the signals are viewed at different locations within digital device 300.

Referring to FIG. 5A, an exemplary externally-supplied clock signal BD_CLK 510 is illustrated along with an internal clock signal RX_CLK 520 that lags the supplied clock signal BD_CLK (indicated by time difference 530). Because of this lag, the value of the supplied clock signal BD_CLK sampled by the SDR register 360 will be a logic "1." The logical "1" output will be an indication to the RX_CLK PHASE CONTROL circuit 345 that it should reduce the amount of delay implemented by the DCM circuit 330. This reduction in the delay will tend to move the internal clock signal RX_CLK into alignment with the supplied clock signal BD_CLK as reflected in FIG. 5B (see time difference 540), which shows the clock signals after the adjustment is made. This operation will be repeated until the delay is such that the value of the SDR register 360 transitions from a logic "1" to a logic "0," which will indicate that the internal clock signal RX_CLK has gone from just lagging the supplied clock signal BD_CLK to just leading the supplied clock signal BD_CLK. This situation is reflected in FIG. 5C, where the internal clock signal RX_CLK has just begun to lead the supplied clock signal BD_CLK (see time difference 550). This transition will occur when the internal clock signal RX_CLK is very nearly aligned with the externally-supplied clock signal BD_CLK. Those of ordinary skill in the art will realize that the transition from lagging to leading (from "1" to "0") will present the potential for metastability at the output of SDR register 360. Standard techniques exist for mitigating the effects of metastability, most commonly the use of multiple additional pipeline registers, and it is assumed that such techniques are employed by any circuitry that utilizes the output of SDR register 360. In FIGS. 3A-3B, mitigation of metastability is performed by the RX_CLK PHASE CONTROL circuit 345 using known techniques.

In one embodiment of the circuitry of FIG. 3A, the phase control circuit 345 is configured such that it will always increase or decrease the amount of delay introduced by the DCM circuit 330 depending on whether the output of SDR register 360 is a logic "1" or a logic "0." In this embodiment, therefore, after an initial adjustment period, the internal clock signal RX_CLK will be constantly adjusted such that it is aligned with the supplied clock signal BD_CLK within one or a small number of delay adjustment increments.

Figure 6A:
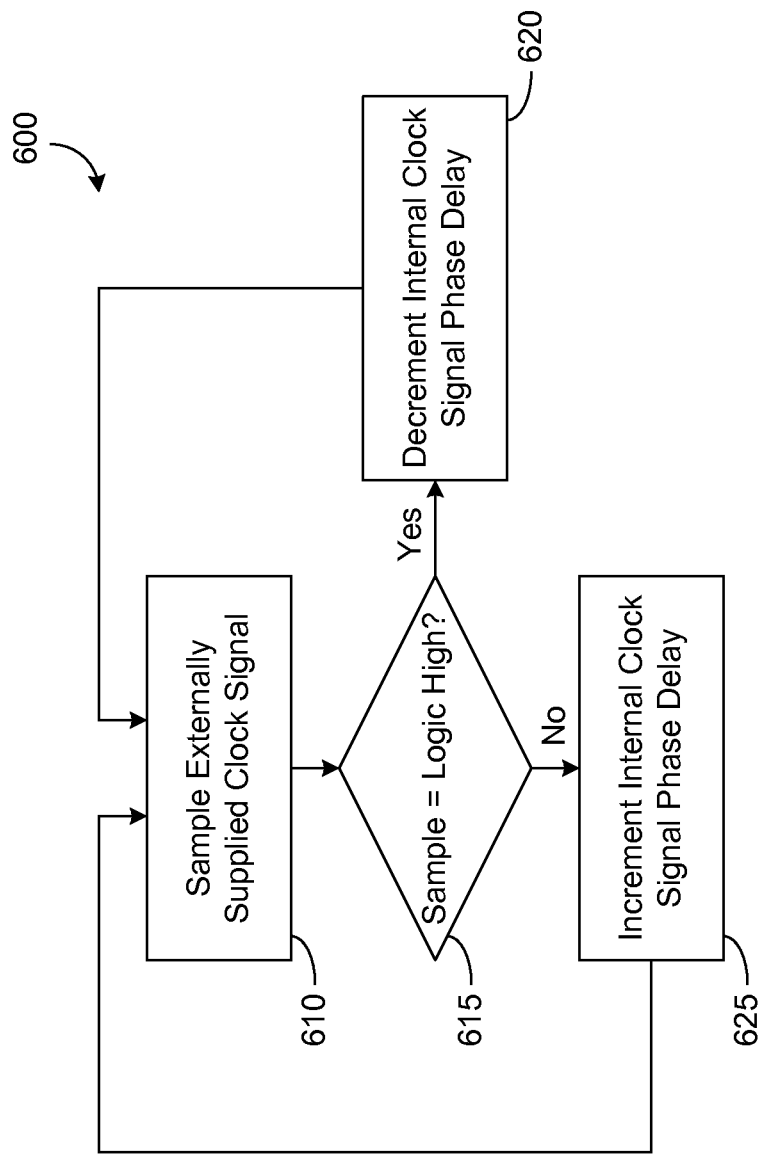
FIGS. 6A-6C illustrate alternative approaches that may be implemented by the phase control circuit shown in FIGS. 3A and 3B.

The operation of this embodiment is generally reflected in the flow chart 600 in FIG. 6A where the phase RX_CLK PHASE CONTROL circuit 345 loops through a process where, with each clock cycle, it increments or decrements the delay introduced by the DCM circuit 330 by a predetermined amount based on the value of the SDR register 360 sampled during that clock cycle. In one embodiment, adjustments are made in increments or decrements equal to the smallest delay adjustment supported by the DCM circuit 330.

As can be seen from the flowchart 600, the adjustment process generally begins at block 610 where the SDR register 360 receives and samples the internal clock signal RX_CLK. After sampling the externally-supplied clock signal BD_CLK at block 610, the SDR register 360 provides the sampled value to the phase control circuit 345.

Typically the sampled value will be either a logic "1" (high), a logic "0" (low). In some instances, the sampled value may be an indeterminate metastable value that can be assigned a logic "1" or logic "0" value. To account for such potentially metastable values, the phase control circuit 345 can pass the sampled signal through a multi-stage pipeline register to mitigate the effects of any metastability, after which the likelihood of a metastable value is extremely low. A determination is thereafter made by the phase control circuit 345 at block 615 to determine whether the sampled value is a logic "1" (high) or a logic "0" (low). If the phase control circuit 345 determines that the sampled value is a logic "1" (high), then at block 620, the phase control circuit 345 decrements the phase delay of the internal clock signal by one adjustment unit. Conversely, if the phase control circuit 345 determines that the sampled value is not a logic "1" (i.e., the sampled value is a logic "0"), then at block 625, the phase control circuit 345 increments the phase delay of the internal clock signal by one adjustment unit.

The embodiment described above may result in adjustment of the delay associated with the internal clock signal RX_CLK every clock cycle, or, alternatively, as frequently as the phase control circuit is capable of adjusting the phase of the internal RX_CLK signal. Alternate embodiments are envisioned where some degree of variation is allowed in the time between phase adjustments. One such embodiment is generally illustrated by the flowchart 600' in FIG. 6B. When the phase control circuit 345 is constructed or configured to implement the embodiment of FIG. 6B, the circuit will operate based on the last X number of samples of the output of the SDR register 360, where X is an integer number greater than one. In this embodiment, the phase control circuit 345 will not adjust the phase delay introduced by the DCM circuit 330 until the output of the SDR register 360 has been at a consistent value for X clock cycles. Thus, in an example where X is equal to four, the phase control circuitry 345 would not adjust the PHASE_ADJ signal to increase the delay introduced by the DCM circuit 330 until it has detected four consecutive logic "0" values at the output of SDR register 360.

Figure 6B:
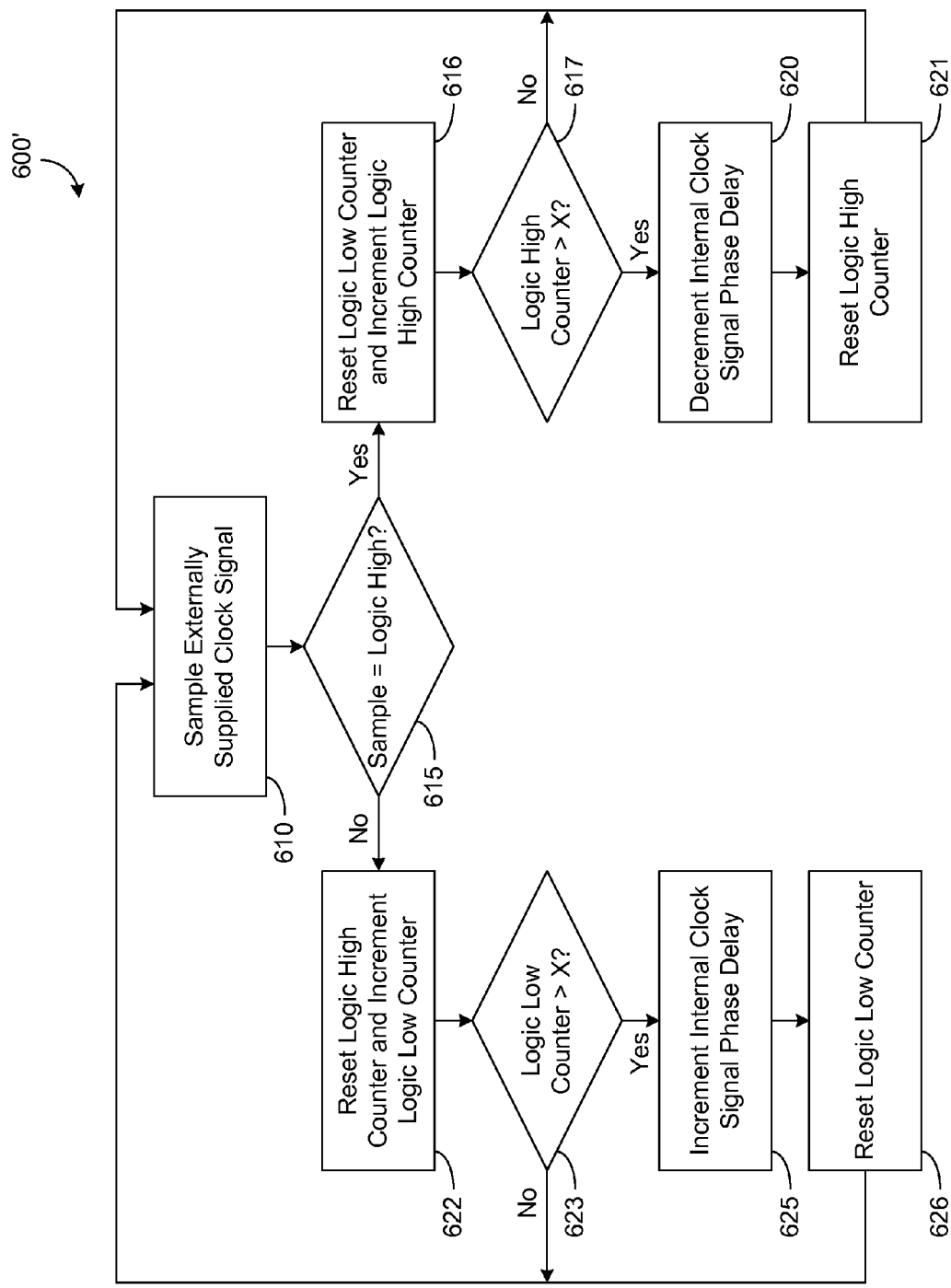

As FIG. 6B shows, the flowchart 600' is similar to the flowchart 600 of FIG. 6A, except that the phase delay of the internal clock signal RX_CLK is not immediately incremented or decremented after the determination at block 615. Instead, if the phase control circuit 345 determines that the value provided by the SDR register 360 is a logic "1" (high), then at block 616, the phase control circuit 345 resets a logic low counter and increments a logic high counter. The phase control circuitry 345 thereafter makes another determination at block 617 to determine if the logic high counter has exceeded a predetermined number X. If the number X has not been exceeded, then no phase delay adjustment is made and the flowchart 600' returns to block 610 to await the next internal clock signal. On the other hand, if the phase control circuit 345 determines that the logic high counter has exceeded the number X, then the phase delay of the internal clock signal is decremented at block 620, and the logic high counter is reset at block 621. In a similar manner, if the phase control circuit 345 determines that the value provided by the SDR register 360 is not a logic "1" (i.e., the sampled value is a logic "0"), then at block 622, the phase control circuit 345 resets the logic high counter and increments a logic low counter. The phase control circuitry 345 subsequently makes another determination at block 623 to determine if the logic low counter has exceeded the predetermined number X. If the number X has not been exceeded, then no phase delay adjustment is made and the flowchart 600' once again returns to block 610 to await the next internal clock signal. But if the phase control circuit 345 determines that the logic low counter has exceeded the number X, then the phase delay of the internal clock signal is incremented at block 625, and the logic low counter is reset at block 626.

While this approach will allow the timing relationship between the internal clock signal RX_CLK and the supplied clock signal BD_CLK to vary somewhat, if X is maintained at a relatively low number (e.g., less than ten), then the circuit will operate to maintain the internal clock signal RX_CLK in, or very nearly in, alignment with the supplied clock signal BD_CLK.

Figure 6C:
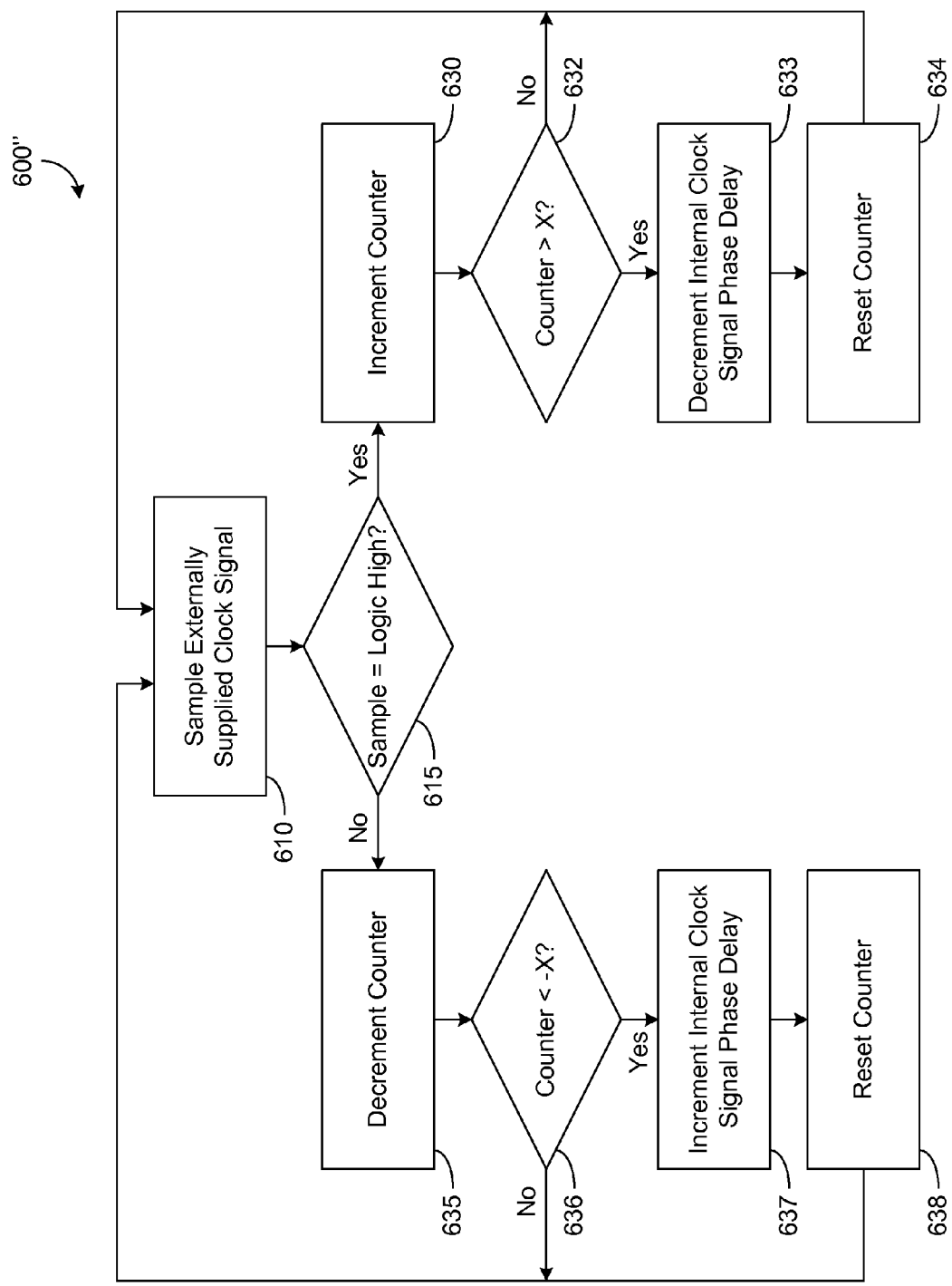

A still further example of how phase adjustment may be accomplished is reflected in the flowchart 600" in FIG. 6C. In this example, a counter is maintained that counts up or down depending on whether a logic "1" or logic "0" is detected at the output of the SDR register 360. The value of the counter is compared to one or more threshold values and the internal clock signal phase delay is adjusted upon the value of the counter reaching, or in some embodiments, exceeding or falling below the one or more threshold values.

Referring to FIG. 6C, it is initially assumed that the value of the counter is set at is initial value, which in the present example is zero. The process will begin at block 610 where the SDR register 360 receives and samples the internal clock signal RX_CLK and provides the sampled value to the phase control circuit 345. After processing of the sampled value to account for potentially metastable values as described above, the phase control circuit 345 will thereafter determine at block 615 whether the sampled value is a logic "1" (high) or logic "0" (low). If the phase control circuit determines that the sampled value is a logic high, it will then increment the count of the counter at step 630. The phase control circuitry 345 thereafter makes another determination at block 632 to determine if the logic high counter has exceeded a predetermined high threshold number X. If the number X has not been exceeded, then no phase delay adjustment is made and the flowchart 600" returns to block 610 to await the next internal clock signal. On the other hand, if the phase control circuit 345 determines that the logic high counter has exceeded the high threshold number X, then the phase delay of the internal clock signal is decremented at block 633, and the counter is reset at block 634. In one embodiment, the high threshold number X is 2400.

In a similar manner, if the phase control circuit 345 determines that the value provided by the SDR register 360 is not a logic "1" (i.e., the sampled value is a logic "0") in the determination made at block 615, then at block 635, the phase control circuit 345 decrements the counter. The phase control circuitry 345 subsequently makes another determination at block 636 to determine if the value of the count for the counter has fallen below a predetermined low threshold number −X. If the count has not fallen below the low threshold number −X, then no phase delay adjustment is made and the flowchart 600" once again returns to block 610 to await the next internal clock signal. But if the phase control circuit 345 determines that the logic low counter has fallen below the low threshold number −X, then the phase delay of the internal clock signal is incremented at block 637, and the counter is reset at block 638. In one embodiment, the low threshold number is −2400.

It should be noted that the examples of FIGS. 6A-6C are just three examples of the manner in which phase control circuit 345 can be constructed or configured to ensure that the internal clock signal RX_CLK and supplied clock signal BD_CLK are at or nearly at alignment at SDR input register 360, and that other approaches to implementing the phase control circuit 345 can be adopted without departing from the scope and spirit of the present disclosure.

Through the operation of the circuitry described above, the circuit of FIG. 3A will ensure that the internal clock signal RX_CLK is always sampling the externally supplied clock signal BD_CLK at or very near to the rising edge of BD_CLK at SDR input register 360. Assuming that the internal clock signal RX_CLK can be distributed throughout the digital device 300 with no or minimal skew (which can occur in many circuits), then other input registers within the digital device 300 can all operate based on internal clock signals (e.g., RX_CLK) that are aligned, or very nearly aligned, in time with one another. Further assuming that the individual signal propagation delays between other input pins and their corresponding input registers closely match the delay between BD_CLK at pin 310 and the SDR input register 360 (which again can occur in many circuits), then all other input signals to digital device 300 can exhibit the same "near-zero" Tsu and Th values exhibited by BD_CLK at SDR input register 360. For example, referring to FIG. 3A, an SDR input register 380 similar to the SDR input register 360 is illustrated for receiving a predefined input to the digital device at external pin 390. Because the input register 380 is clocked with the internal clock signal RX_CLK, and because the clock signal RX_CLK is internally distributed in such a manner that there will be no or little variation between the internal RX_CLK signals received at input register 380 and input register 360, and because the delay between pin 310 and input register 360 closely matches the delay between pin 390 an input register 380, the circuitry of FIG. 3A will ensure that the setup times and hold times for the inputs to the digital device 300 are at, or very nearly at, zero. More specifically, in the example described above, the disclosed clocked digital device will have a set-up time for the signal received at input pin 390 with respect to the clock signal supplied to the pin 310 that is less than 8% of the period of the clock signal supplied to pin 310.

It will be appreciated by those of ordinary skill in the art having the benefit of this disclosure, that the circuitry of FIG. 3A will dynamically operate to ensure that the internal clock signal RX_CLK is aligned, or very nearly aligned, with the externally-supplied clock signal BD_CLK such that Tsu and Th are at, or very nearly at, zero with respect to the externally-supplied clock signal BD_CLK. This alignment will exist regardless of changes in the behavior and/or performance of digital device 300 that could arise, for example, from changes in the process used to make the device, the temperature, voltage conditions, or other variables that could tend to impact the alignment of the clocks internal to the digital device 300 with respect to the externally-supplied clock signal BD_CLK.

In the circuit of FIG. 3A, the amount of time (and the amount of overall adjustment) required to initially get the internal clock signal RX_CLK into the desired alignment with the supplied clock signal BD_CLK will vary depending on the extent of the initial non-alignment. One approach that may be used to reduce the amount of time required to bring the two clocks into alignment is to introduce some initial delay into the supplied clock signal BD_CLK before it is sampled by the SDR register 360 to ensure that the initial non-alignment is no more than half of the period of the supplied clock. An alternative circuit in accordance with such an embodiment is illustrated in FIG. 3B. Another approach that may be used to reduce the amount of time required to bring the two clocks into alignment is to introduce an initial fixed delay (or phase shift) into the DCM circuit 330. This provides the option to either increase or decrease the initial delay, thereby providing increased flexibility in minimizing the time required to achieve clock alignment at SDR input register 360.

The circuitry of FIG. 3B is similar to that of FIG. 3A, except that a first delay buffer 355 has been added between the clock input pin 310 and the SDR register 360 and a second delay buffer 375 has been added between the input pin 390 and the SDR input register 380. The purposes of the delay buffers 355 and 375 is to add some delay to the received signals. The delay buffers 355 and 375 may be of conventional construction. In the embodiment where the digital device 300 is a Xilinx FPGA, the delay buffers 355 and 375 may take the form of a user-configurable delay element having a precisely defined input delay.

As those of ordinary skill in the art will appreciate, when constructing a digital device, like digital device 300, it is possible to obtain estimated set-up and hold times for the various inputs to the device. For example, when digital device 300 is an FPGA, such as a Xilinx FPGA, the software package used to program and configure the FPGA can often provide calculated or estimated set-up and hold times for each configured input of the device.

As those of ordinary skill in the art will also appreciate, calculated or estimated set-up and hold times that are roughly symmetric about zero reflect a condition where the estimated sampling window is roughly symmetric about the anticipated active clock edge. Calculated or estimated setup and hold times that are not roughly symmetric about zero reflect a situation where the anticipated sampling window is skewed in one direction away from the active clock edge or edges. In situations where the calculated or estimated set-up and hold times are not symmetric about zero, but instead are skewed to provide a sampling window occurring after the active clock edge, the delay element 355 can be used to introduce a delay in the signal path to SDR register 360 in order to shift the sampling window backwards toward the clock edge. Additionally, imparting an initial delay (or phase shift) to the DCM 330 can compensate for sampling windows that are skewed in either direction (earlier or later) relative to the active clock edge or edges. In either case the net result is that initial Tsu and Th times can be made roughly symmetric about zero.

In the embodiment described above, whenever an initial delay is introduced to the signal applied to the SDR register 360, a corresponding initial delay should generally be introduced into the other input registers that are intended to be clocked in the same manner. As such, in the example of FIG. 3B, whenever an initial delay is introduced into the signal provided to SDR register 360 via the delay element 355, the same amount of initial delay should generally be introduced into the signal applied to SDR register 380 via the delay element 375. The use of the same initial delay periods will tend to ensure common operating characteristics between SDR registers 360 and 380 and, accordingly, that both registers exhibit Tsu and Th values that are at, or nearly at, zero with respect to the externally-supplied clock signal BD_CLK.

The ability of the circuitry of FIGS. 3A and 3B to guarantee setup and hold times of zero or very nearly zero for input signals captured by RX_CLK enables the construction of a circuit that can dynamically compensate for variations in operating or process conditions and ensure that the clock-to-output timing (Tco) for the digital device 300 is also at, or nearly at, zero. One example of such a circuit is depicted in FIG. 7.

Figure 7:
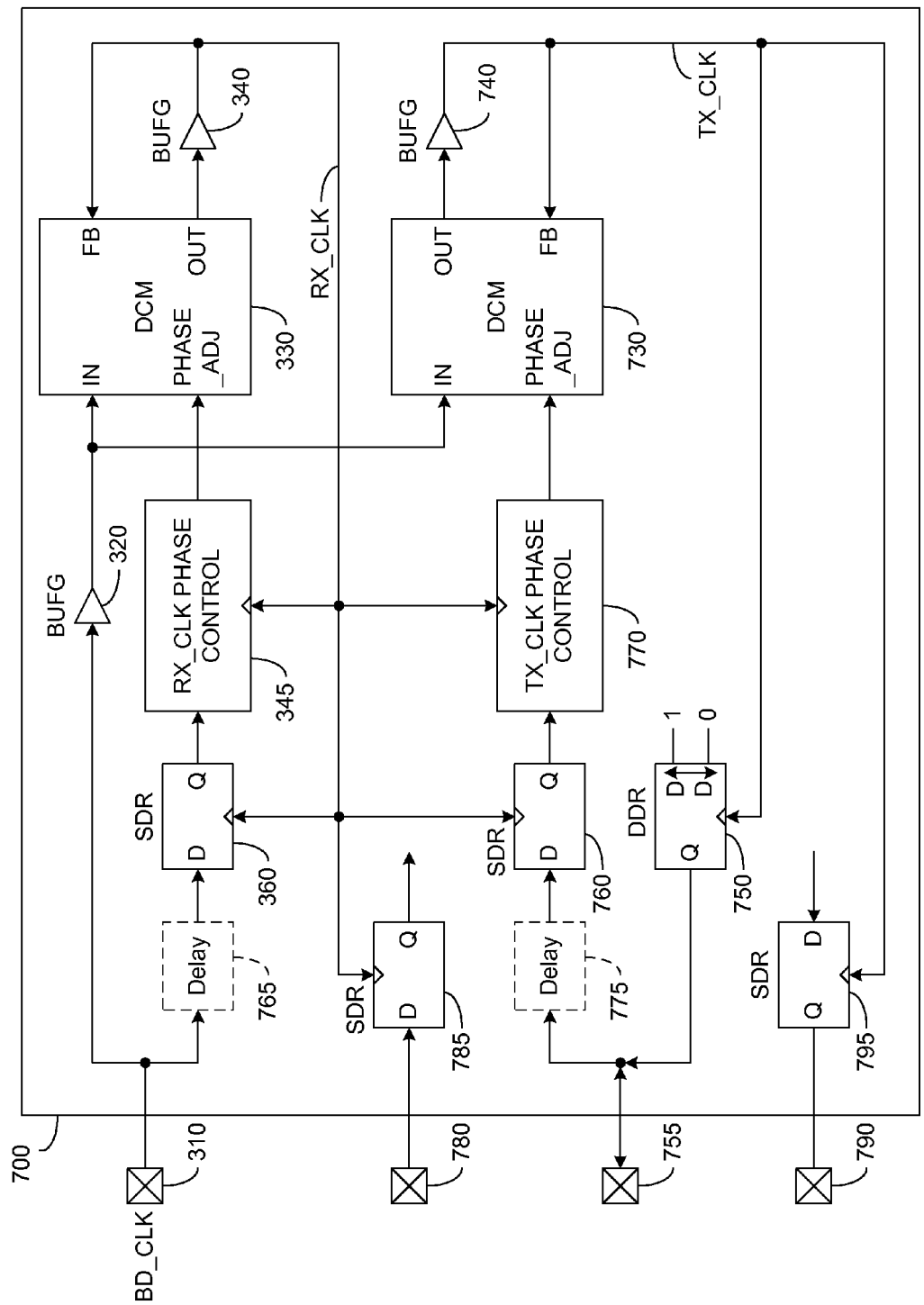
FIG. 7 illustrates a novel circuit that can dynamically compensate for variations in operating or process conditions and ensure that Tco for a digital device is at, or nearly at zero, with respect to a reference clock signal.

Referring to FIG. 7, a circuit is disclosed that may be included in a clocked digital device. The illustrated circuit includes circuitry for generating an internal reception clock signal RX_CLK as described above in connection with FIG. 3B. FIG. 7 also discloses circuitry for generating an internal transmission data clock signal (referred to herein as "TX_CLK") used to clock the output registers and for dynamically adjusting the timing of the internal transmission clock signal TX_CLK to ensure that the clock-to-output time Tco is zero, or very nearly zero, with respect to the supplied clock signal BD_CLK for output signals sourced by registers that are also clocked by the internal transmission clock signal TX_CLK. In one embodiment, the circuit is such that the clock-to-output time with respect to an externally supplied clock signal is less than 8% of the period of the externally supplied clock signal.

Referring to FIG. 7, the supplied clock signal BD_CLK is connected from the clock input pin 310 to the input (IN) of a second DCM 730. The second DCM circuit 730 operates like the DCM circuit 330 discussed in connection with FIGS. 3A and 3B and may be constructed or configured in the same manner.

The output (OUT) of the DCM circuit 730 is provided to a third clock distribution buffer 740. The third clock distribution buffer 740 operates like, and may be constructed or configured like, the first and second clock distribution buffers 320 and 340 discussed above in connection with FIGS. 3A and 3B.

The output of the third clock distribution buffer 740 represents the internal clock used to clock the output registers, and is described herein as the internal transmission clock signal TX_CLK. The internal transmission clock signal TX_CLK is provided to the feedback input (FB) of the second DCM circuit 730, which will adjust its output clock signal (OUT) such that the steady-state timing differences between its input (IN) and its feedback input (FB) are held to a predetermined fixed delay quantity (or phase shift) plus or minus a variable delay quantity (or phase shift), with the latter set by the signal(s) provided to the DCM's phase adjust (PHASE_ADJ) input.

In the embodiment of FIG. 7, the internal transmission clock signal TX_CLK is dynamically adjusted and used to clock the output registers of the digital device 700 such that Tco is at, or very nearly at, zero. In the illustrated circuit, this adjustment is accomplished through the use of a dual data rate (DDR) output register 750, a representative bidirectional (IO) pin 755, an SDR input register 760 and a second phase control circuit (TX_CLK PHASE CONTROL) 770. These components operate similarly to, and may be constructed or configured in a manner similar to, their counterparts in FIGS. 3A and 3B.

The DDR output register 750 is clocked with the internal transmission clock signal TX_CLK. The data input(s) to the DDR output register 750 is/are set such that the output of the DDR output register 750 is a signal that will transition between logic low ("0") and logic high ("1") in response to the clock signal provided by the internal transmission clock signal TX_CLK. Because the DDR output register 750 responds to both the rising and the falling edges of the internal transmission clock signal TX_CLK (by virtue of the register being a dual data rate device), the output of the DDR output register 750 will be a clock signal that has characteristics, including its period, that are substantially the same as the internal transmission clock signal TX_CLK that is used to clock DDR output register 750.

The output of DDR register 750 is provided to an IO pin 755 (as noted earlier). The signal at the IO pin 755 is, in turn, provided as an input to the SDR input register 760. This SDR register 760 is clocked with the internal reception clock signal RX_CLK which, as described above, has been adjusted such that input signals captured with RX_CLK exhibit setup and hold times equal to, or very nearly equal to, zero. Because of this, the data value sampled by the SDR register 760 will provide a good indication of the Tco (or the clock-to-output time) for the clock signal supplied to IO pin 755.

The operation of the SDR Register 760 is similar to that described above in connection with SDR Register 360 of FIGS. 3A and 3B. If the signal provided to the input of register 760 is lagging the internal reception clock signal RX_CLK at input register 760, then the SDR register 760 will sample a digital "0." If the signal provided to the input of register 760 is leading the internal reception clock signal RX_CLK at input register 760, then the SDR register 760 will sample a digital "1." The second phase control circuit (TX_CLK PHASE CONTROL) 770 receives the output of SDR register 760 and, using similar techniques and methods described above in connection with the phase control circuit (RX_CLK PHASE CONTROL) 345 of FIGS. 3A and 3B, sets the PHASE_ADJ input for the second DCM circuit 730 until the clock signal at IO pin 755 is aligned, or very nearly aligned, with the internal reception clock signal RX_CLK at SDR input register 760. Assuming close time alignment between the RX_CLK signals at registers 360 and 760, and further assuming that the delay between pin 310 and input register 360 closely matches the delay between pin 755 and input register 760, then the signal at pin 755 will be closely time-aligned with BD_CLK at pin 310 when proper clock-to-data alignment has been achieved at each of the input registers 360 and 760. This condition, alignment of the signal at pin 755 with the clock signal BD_CLK at pin 310, represents the attainment of zero or near-zero Tco.

In general operation of the device 700 of FIG. 7, the internal transmission clock signal TX_CLK signal can be applied to all output buffers for which a Tco of zero, or very nearly zero, is desired. The use of such a clock signal will ensure that the outputs provided by the digital device 700 are updated coincident with the active edge or edges of the clock signal BD_CLK. Because of the dynamically adjustable nature of the illustrated circuit, this condition of a Tco of zero or substantially zero will be achieved.

In the embodiments of FIGS. 3A-3B and 7, the internal clock signals RX_CLK and TX_CLK are dynamically adjusted to ensure that: (i) the input characteristics of the digital devices 300 and 700 are such that Tsu and Th are zero or substantially zero, and (ii) the output characteristics of the digital devices 300 and 700 are such that Tco is zero, or substantially zero. In certain embodiments, there may a reason or a benefit to adjust Tsu and/or Tco, either globally or on a pin-by-pin basis, to have values that vary from zero. Such variation may be accomplished in several different ways.

Referring again to FIG. 3B, and in particular to delay elements 355 and 375, one particular method for setup time adjustment may be realized. It has already been noted that setting delay elements 355 and 375 to the same delay value will result in near-zero setup times for the input signals at pin 310 (BD_CLK) and pin 390. If, instead, the delay 375 between pin 390 and input register 380 is greater than the delay 355 between DB_CLK pin 310 and input register 360, then the sampling window for the signal at pin 390 will be shifted earlier in time (before the clock edge) by approximately the difference in delay values. Alternatively, if the delay 375 between pin 390 and input register 380 is less than the delay 355 between DB_CLK pin 310 and input register 360, then the sampling window for the signal at pin 390 will be shifted later in time (after the clock edge) by the difference in delay values. It is noteworthy that the duration of the sampling windows for all signals clocked by the internal RX_CLK is still reduced to near zero, but that the position of each sampling window may be specified with a high degree of accuracy relative to the active clock edge. This technique can be useful for scenarios in which different data signals are skewed relative to one another as seen at the inputs to digital system 300.

Referring to FIG. 7, and in particular to delay elements 765 and 775, one particular method for adjusting clock-to-output timing may be realized. It has already been noted that setting delay elements 765 and 775 to the same delay value will result in near-zero clock-to-output timing for the signal at pin 755. If, instead, the delay 775 between pin 755 and input register 760 is greater than the delay 765 between DB_CLK pin 310 and input register 360, then the data transitions on pin 755 will appear to occur earlier in time (reduced Tco). Alternatively, if the delay 775 between pin 755 and input register 760 is less than the delay 765 between DB_CLK pin 310 and input register 360, then the data transitions on pin 755 will appear to occur later in time (increased Tco). It is important to note that this Tco adjustment is a "global" adjustment, applying to all output signals sourced from registers clocked by TX_CLK. To the extent that one desires to implement a non-zero Tco for an individual data output signal, one could add a delay element (not shown) into the path of that output between its output register and external pin.

In some embodiments, the dynamically adjusted internal clock signals RX_CLK and TX_CLK may be used to clock additional components in the digital device 700. For example, in some embodiments, the digital device 700 may have an another input pin 780 that is connected to the input of another SDR register 785. The internal reception clock signal RX_CLK may then be used to clock the SDR register 785, the output from which may in turn be coupled with, and provide an output signal to, other component(s) (not expressly shown) in the digital device 700. Alternatively, or in addition, the digital device 700 may have an output pin 790 that is connected to the output of another SDR register 795. The internal transmission clock signal TX_CLK may then be used to clock the SDR register 795, the input from which may be coupled with, and receive an input signal from, still other component(s) (not expressly shown) in the digital device 700.

Because the circuitry described above in connection with FIG. 7 for generating and adjusting the internal transmission clock signal TX_CLK signal relies on proper alignment of the internal reception clock signal RX_CLK with the externally-supplied clock signal BD_CLK for proper operation, the circuitry used to generate and adjust the internal transmission clock signal TX_CLK should generally not be activated until some time has passed after the activation of the circuitry for generating and properly aligning the internal reception clock signal RX_CLK. This time period will ensure that the internal reception clock signal RX_CLK is aligned, or nearly aligned, with the received clock signal BD_CLK and ensure proper operation of the circuitry for generating and adjusting the internal transmission clock signal TX_CLK clock.

The above embodiments are illustrative and not limiting. Other and further embodiments utilizing one or more aspects of the inventions described above can be devised without departing from the spirit of Applicant's invention. As used herein, the concept of a clocked digital device is intended to include devices that exclusively utilize digital signals as well as devices that utilize both digital and analog signals. Except as otherwise specifically noted, the examples discussed herein use the rising (low-to-high) edge of the various clock signals as the active edge. This is exemplary and representative. The methods and apparatus disclosed herein are also applicable to systems and devices that use the falling (high-to-low) edge of a clock signal as the active edge and to devices and systems that use both edges as active edges and/or devices and systems that use the rising edge of one clock signal as the active edge and the falling edge of another clock signal as an active edge.

Further, the order of steps described herein can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants. Applicants intend to fully protect all such modifications and improvements that come within the scope or range of equivalent of the following claims.

What is claimed is:

1. A signal calibration circuit, comprising:
a signal manager circuit configured to receive an externally supplied signal varying between a first logic level and a second logic level, the signal manager circuit outputting a delayed internal signal having a frequency corresponding to a frequency of the externally supplied signal and varying between the first logic level and the second logic level;
a signal register circuit configured to receive the delayed internal signal from the signal manager circuit, the signal register circuit sampling a logic level of the externally supplied signal and outputting the sampled logic level of the externally supplied signal at an active edge of the delayed internal signal; and
a delay generator circuit configured to receive the sampled logic level of the externally supplied signal and output a phase adjustment signal;
wherein the signal manager circuit is further configured to adjust an amount of delay between an active edge of the externally supplied signal and an active edge of the delayed internal signal based on the sampled logic level of the received externally supplied signal, the delayed internal signal providing a feedback signal for the signal manager circuit.

2. The circuit of claim 1 wherein the signal manager circuit adjusts the amount of delay by increasing the amount of delay in response to the sampled logic level of the externally supplied signal being the second logic level.

3. The circuit of claim 1 wherein the signal manager circuit adjusts the amount of delay by adjusting a logic level of a delay counter based on the sampled logic level of the externally supplied signal.

4. The circuit of claim 1 wherein the delayed internal signal is distributed to other circuits that are not part of the signal calibration circuit.

5. The circuit of claim 4 further comprising a signal input circuit configured to receive the delayed internal signal from the signal manager circuit, the signal input circuit sampling a logic level of an input signal at an active edge of the delayed internal signal.

6. The circuit of claim 5 wherein the signal manager circuit adjusts the amount of delay such that a set-up time for the input signal with respect to the externally supplied signal is less than 8% of a period of the externally supplied signal.

7. The circuit of claim 1 wherein the signal manager circuit adjusts the amount of delay by:
   (a) maintaining a count on a logic high counter;
   (b) determining whether the sampled logic level of the externally supplied signal is logic high or logic low;
   (c) resetting the count of the logic high counter whenever the sampled logic level of the externally supplied signal is determined to be logic low;
   (d) incrementing the count of the logic high counter whenever the sampled logic level of the externally supplied signal is determined to be logic high; and
   (e) decreasing the amount of delay between an active edge of the externally supplied signal and an active edge of the delayed internal signal when the count of the logic high counter exceeds a threshold number.

8. The circuit of claim 7 wherein the signal manager circuit adjusts the amount of delay by:
   (a) maintaining a count on a logic low counter;
   (b) determining whether the sampled logic level of the externally supplied signal is logic high or logic low;
   (c) resetting the count of the logic low counter whenever the sampled logic level of the externally supplied signal is determined to be logic high;
   (d) incrementing the count of the logic low counter whenever the sampled logic level of the externally supplied signal is determined to be logic low; and
   (e) increasing the amount of delay between an active edge of the externally supplied signal and an active edge of the delayed internal signal when the count of the logic low counter exceeds a threshold number.

9. The circuit of claim 1 wherein the signal manager circuit adjusts the amount of delay by:
   (a) maintaining a count on a counter;
   (b) determining whether the sampled logic level of the externally supplied signal is logic high or logic low;
   (c) increasing the count whenever the sampled logic level of the externally supplied signal is determined to be logic high;
   (d) decrementing the count whenever the sampled logic level of the externally supplied signal is determined to be logic low;
   (e) decreasing the amount of delay between an active edge of the externally supplied signal and an active edge of the delayed internal signal when the count is greater than a first threshold number; and
   (f) increasing the amount of delay between an active edge of the externally supplied signal and an active edge of the delayed internal signal when the count is less than a second threshold number.

10. A circuit for controlling a set-up time of an externally supplied input signal with respect to an externally supplied signal, the circuit configured to:
    receive the externally supplied signal;
    provide a first signal having a frequency substantially equal to a frequency of the externally supplied signal and a phase that is phase-shifted with respect to a phase of the externally supplied signal;
    sample the externally supplied signal in response to an active edge of the first signal;
    sample the externally supplied input signal at the active edge of the first signal; and
    use the sampled logic level of the externally supplied signal to adjust an amount of the phase-shift between the externally supplied signal and the first signal to control the set-up time for the input signal with respect to the externally supplied signal.

11. The circuit of claim 10 further configured to:
    provide a second signal having a frequency substantially equal to the frequency of the externally supplied signal and a phase that is phase-shifted with respect to the phase of the externally supplied signal;
    provide a changing output signal that changes from a logic low level to a logic high level in response to an active edge of the second signal;
    sample the logic level of the changing output signal in response to the first signal;
    provide an output signal in response to the second output signal; and
    use the sampled logic level of the changing output signal to adjust the amount of the phase-shift between the externally supplied signal and the second signal to reduce the signal-to-output time for the output signal relative to the externally supplied signal.

12. The circuit of claim 10 wherein the circuit samples the externally supplied signal in response to an active edge of the first signal by sampling the externally supplied signal in response to a rising edge of the first signal.

13. The circuit of claim 10 wherein the circuit uses the sampled logic level of the externally supplied signal to adjust the amount of the phase-shift between the externally supplied signal and the first signal to control the set-up time for the input signal with respect to the externally supplied signal by:
    (i) adjusting an amount of delay between an active edge of the externally supplied signal and an active edge of the first signal by a set amount in response to the sampled logic level of the externally supplied signal being logic low;
    (ii) further sampling the externally supplied signal in response to an active edge of the first signal;
    (iii) again adjusting the amount of delay between an active edge of the externally supplied signal and an active edge of the first signal by a set amount in response to the further sampled logic level of the externally supplied signal being logic low; and
    (iv) repeating steps (ii)-(iii) until the further sampled logic level of the externally supplied signal is logic high.

14. The circuit of claim 10 wherein the circuit samples the externally supplied signal in response to an active edge of the first signal by passing the externally supplied signal through a multi-stage pipeline register and sampling an output of the pipeline register on an active edge of the first signal.

15. The circuit of claim 14 wherein the circuit samples the output of the pipeline register on an active edge of the first signal by sampling the output of the pipeline register upon a falling edge of the first signal.

16. The circuit of claim 13 wherein the circuit samples the externally supplied input signal at an active edge of the first signal by introducing a delay for the supplied input signal and sampling the delayed input signal, where the delay is selected such that the set-up time and hold time are substantially symmetric about a central axis.

17. A circuit for controlling a set-up time of an input signal with respect to a reference signal towards a desired logic level, the circuit configured to:
    receive the reference signal and providing a first output signal that has the same frequency as the reference signal but is phase-shifted with respect to the reference signal;
    sample the reference signal at an active edge of the first output signal;
    pages a phase relationship between the reference signal and the first output signal in response to the sampled logic level of the reference signal to bring the output signal towards an alignment with respect to the reference signal that brings the set-up time towards the desired logic level; and sample the input signal at an active edge of the first output signal.

18. The circuit of claim 17 wherein the circuit adjusts the phase relationship by advancing a phase of the first output signal in response to the sampled logic level of the reference signal being logic low.

19. The circuit of claim 17 wherein the circuit is further configured to reduce the signal-to-output time of an output signal with respect to the reference signal by:

receiving the reference signal and providing a second output signal that has the same frequency as the reference signal but is phase-shifted with respect to the reference signal;

producing a digital flip-flop signal that transitions from one logic level to another logic level in response to each active edge of the second output signal;

sampling the digital flip-flop signal at an active edge of the first output signal;

adjusting a phase relationship between the reference signal and the second output signal in response to the sampled logic level of the digital flip-flop signal; and using the second output signal to signal a clocked output buffer that provides the output signal.

20. The circuit of claim 19 wherein the circuit adjusts the phase relationship between the reference signal and the second output signal in response to the sampled logic level of the digital flip-flop signal by adjusting the phase relationship such that the signal-to-output time for the output signal provided with respect to the reference signal is less than 8% of a period of the reference signal.

* * * * *